(12) United States Patent
Lu et al.

(10) Patent No.: US 7,102,190 B2
(45) Date of Patent: Sep. 5, 2006

(54) FLASH MEMORY CELL WITH A UNIQUE SPLIT PROGRAMMING CHANNEL AND READING CHANNEL

(75) Inventors: Hsiang-Tai Lu, Hsin-Chu (TW); Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 255 days.

(21) Appl. No.: 10/762,166

(22) Filed: Jan. 21, 2004

(65) Prior Publication Data
US 2005/0156223 A1   Jul. 21, 2005

(51) Int. Cl.
*H01L 29/788* (2006.01)
(52) U.S. Cl. .............. 257/315; 257/314; 438/201; 438/211
(58) Field of Classification Search .......... 257/315, 257/314, 323, 324; 438/201, 211, 257, 221, 438/591, 593
See application file for complete search history.

(56) References Cited

U.S. PATENT DOCUMENTS 5,648,669 A   7/1997   Sethi et al. ............... 257/318
6,255,169 B1   7/2001   Li et al. ................... 438/264

*Primary Examiner*—Douglas W. Owens
(74) *Attorney, Agent, or Firm*—Thomas, Kayden, Horstemeyer & Risley

(57) ABSTRACT

A structure for flash memory cells is disclosed, Isolation regions are formed in a semiconductor region separating cells and also separating programming bit line channel regions of a cell from reading bit line charmel regions of a cell. A conductive floating gates has a first portion in the programming bit line channel region of a cell and a second portion in the reading bit line channel region of the cell and a third connecting portion passing over an isolation region. A conductive control gate is separated from the floating gate by an intergate insulator layer and has a first portion entirely disposed over the first floating gate portion, where the first floating gate portion completely covers the space between a source region and a drain region, a second portion disposed over the second floating gate portion, where the second floating gate portion does not extend all the way from a source region to a drain region, the second control gate portion completing the covering of the space between a source region and a drain region and a third connecting portion disposed over the third floating gate portion. A programming bit line channel contact line and a reading bit line channel contact line are disposed over a covering insulator layer and connect to drain regions through the covering insulator layer.

52 Claims, 10 Drawing Sheets

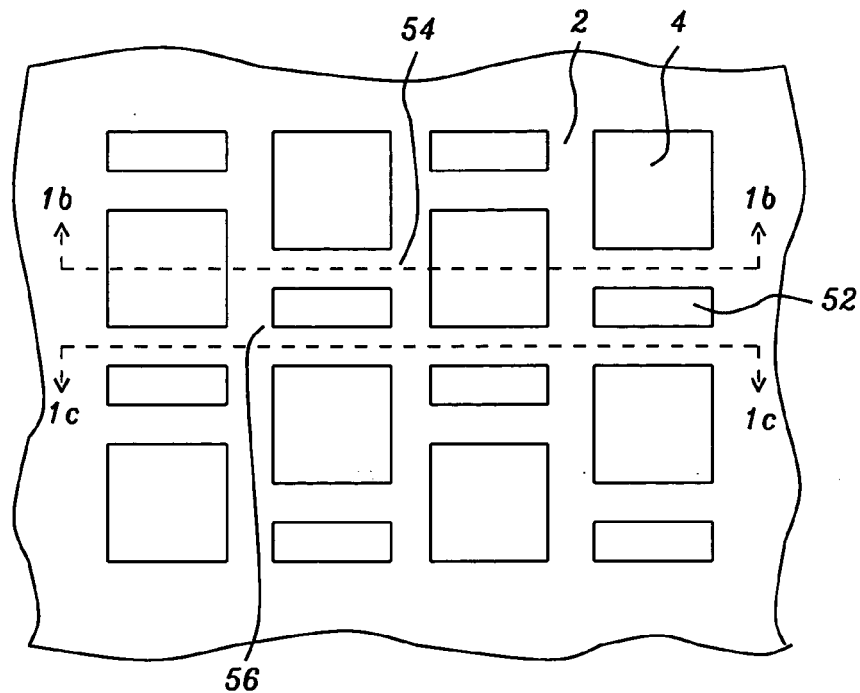
FIG. 1a – Prior Art
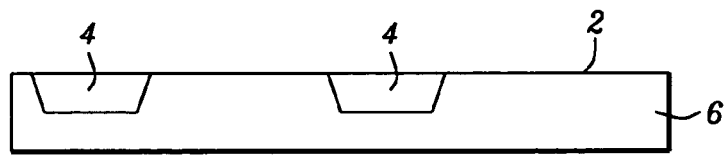
FIG. 1b – Prior Art
FIG. 1c – Prior Art

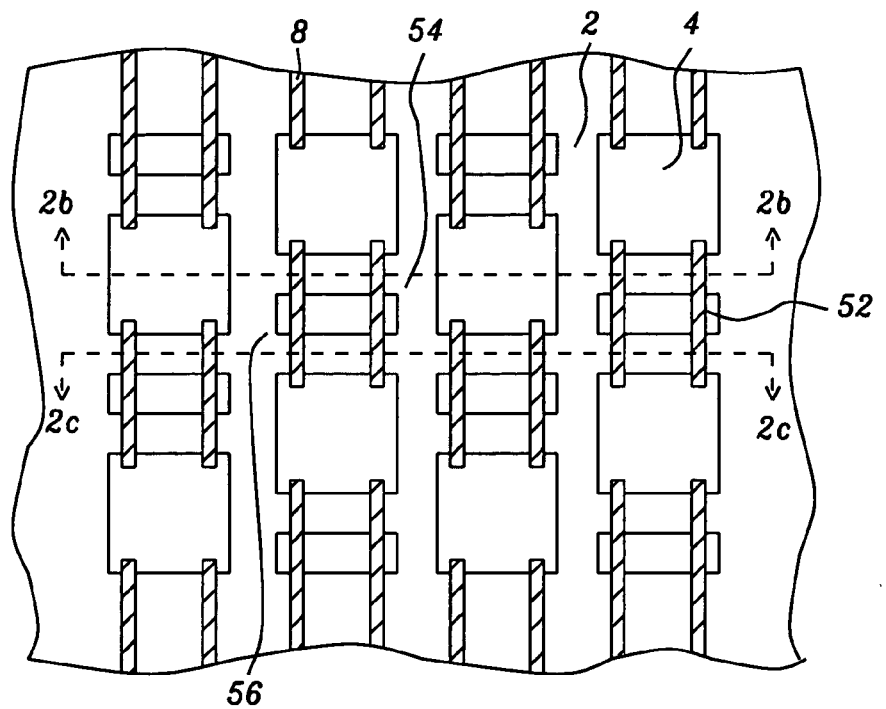
FIG. 2a – Prior Art
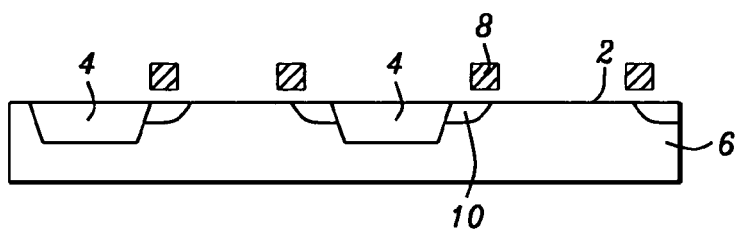
FIG. 2b – Prior Art
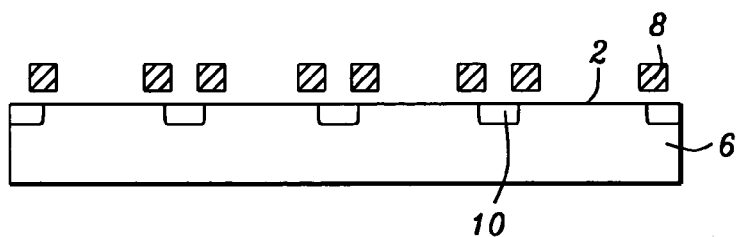
FIG. 2c – Prior Art

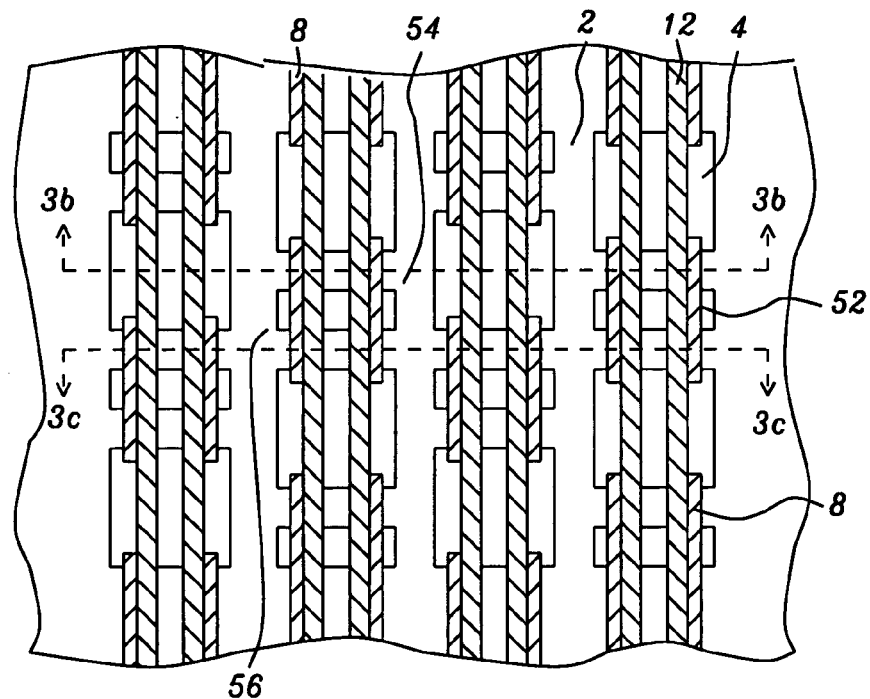
*FIG. 3a — Prior Art*
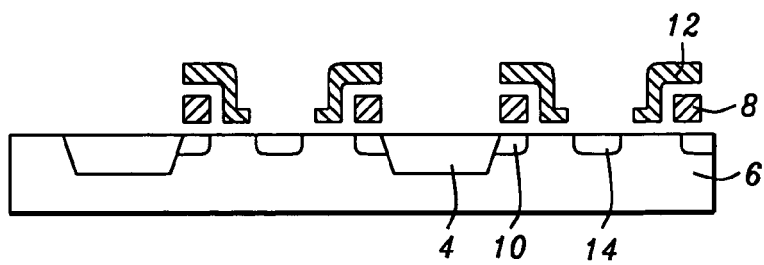
*FIG. 3b — Prior Art*
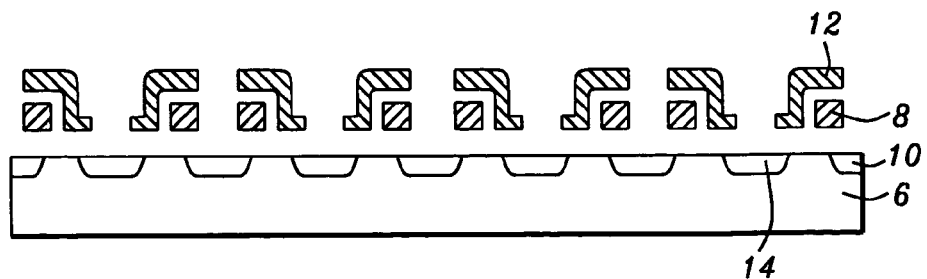
*FIG. 3c — Prior Art*

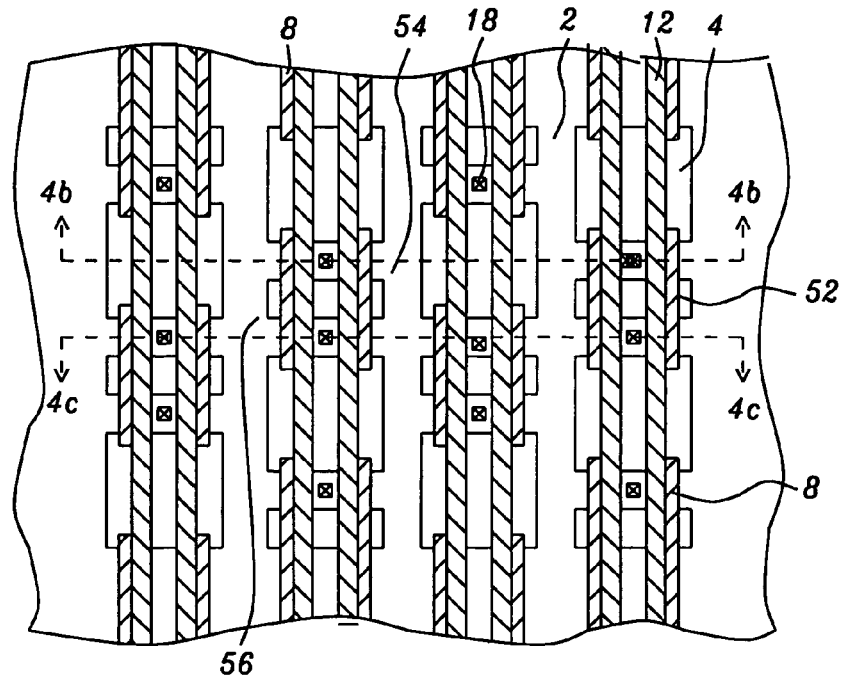
FIG. 4a – Prior Art
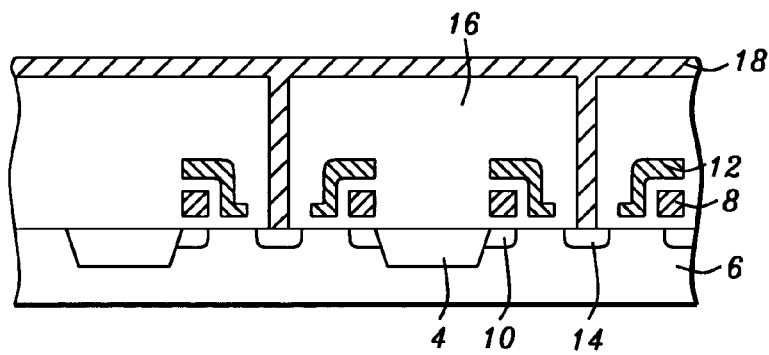
FIG. 4b – Prior Art
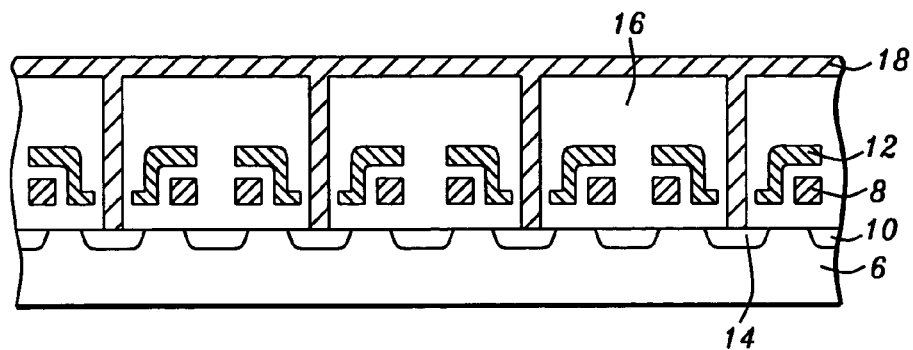
FIG. 4c – Prior Art

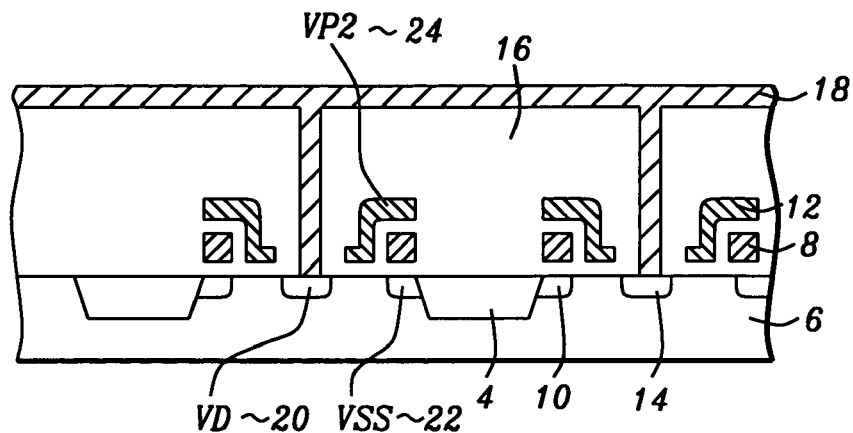
FIG. 5a – Prior Art
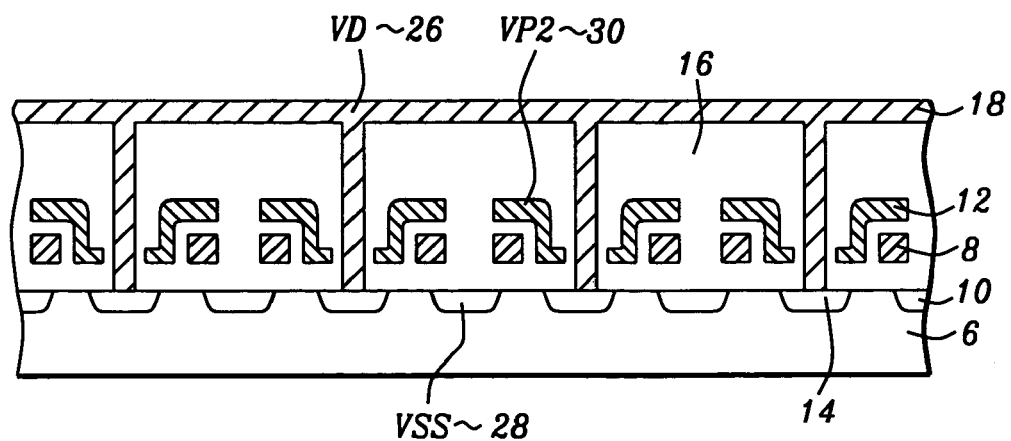
FIG. 5b – Prior Art

FLASH MEMORY CELL WITH A UNIQUE SPLIT PROGRAMMING CHANNEL AND READING CHANNEL

BACKGROUND OF THE INVENTION (1) Field of the Invention

The present invention relates generally to semiconductor integrated circuit technology and more particularly to non-volatile memory devices such as flash EEPROMs (Electrically Erasable Programmable Read Only Memory).

(2) Description of Prior Art

Changes in time of the operating characteristics of a memory device are referred to as its endurance characteristics. Problem-free operation of a device for as long a period as possible should always be a basic requirement in its design and manufacture. Thus providing designs and manufacturing procedures leading to improved endurance characteristics are of fundamental importance.

The underlying concepts of the present invention can be succinctly stated. As a general rule, appropriate for flash memory cells, changes in operating characteristics occur with greater frequency at earlier times when larger potential differences exist or when potential differences exist over larger areas. Consequently, reducing potential differences, or reducing the area over which potential differences are applied can achieve improvements in endurance characteristics. These reductions should be implemented in such a way that other performance requirements are not impacted and so that there are minimal process and mask layout changes that are needed. The present invention provides a unique structure for a flash memory cell that allows for operation of the flash memory cell in a specified manner, which results in significantly improved endurance characteristics. The present invention also provides a method to fabricate such memory cells.

A traditional flash memory cell containing programming and reading channels and a method to fabricate such a traditional memory cell is shown in FIGS. 1a–4c. FIGS. 1a, 2a, 3a and 4a show top views depicting the progression of the process. FIGS. 1b, 2b, 3b and 4b show cross-sectional views depicting stages in forming a programming bit line channel and FIGS. 1c, 2c, 3c and 4c show cross-sectional views depicting stages in forming a reading bit line channel. Shown in FIGS. 1a, 1b and 1c are isolation regions, regions 4 and 52, such as shallow trench isolation (STI) regions, formed in a substrate, 6, which is usually a silicon substrate. Isolation regions 52 are unique to split programming and reading channel memory cells in which they serve to separate programming bit line channel regions, 54 and reading bit line regions, 56, of the memory cell. The area, 2, surrounding the isolation regions is the active area that will contain the memory cell devices. A gate insulator layer covering the active region, which for the sake of clarity is not explicitly shown in the figure, is usually a gate oxide layer. As shown in FIGS. 2a, 2b and 2c conductive floating gates, 8, are now formed, which are usually polysilicon floating gates. It is seen that a floating gate has a portion situated in the programming bit line channel region, 54 and a portion situated in the reading bit line channel region, 56 and a connecting portion that passes over the isolation region 52. An insulating layer that is required over the conductive gate is not explicitly shown and is usually formed by thermal oxidation. The positions for source regions, 10, are delineated at this stage and the source regions are now formed. Referring now to FIGS. 3a, 3b and 3c, conductive control gates, 12, are shown, which usually are polysilicon control gates. The conductive control gates being parallel conductive lines are appropriate for and are utilized as word lines. At this stage the positions of drain regions, 14, between adjacent control gates, are delineated and the drain regions are now readily formed. The next stage of the process is shown in FIGS. 4a, 4b and 4c. An overall insulator layer, 16, is then formed and conductive contact lines, 18 and 32, are disposed over the overall insulator layer, covering the programming bit line channels and the reading bit line channels, respectively and contacting drain regions, 14, through the overall insulator layer, 16. It is noted that the structures of the floating gates and control gates are the same in the programming bit line channels, FIGS. 3b and 4b and in the reading bit line channels, FIGS. 3c and 4c.

As is well known, the array operation of flash memory devices is accomplished through three basic operations. In programming operations electrons are introduced into floating gates where they are stored. Erasing operations remove the stored charge from floating gates. Thus, there are two states, charged and uncharged, that floating gates could be in. Read operations are used to determine in which of the two states particular floating gates are in. This is accomplished utilizing the affect that a negatively charged floating gate causes an increase in the threshold voltage, which is the applied voltage required to obtain a conducting channel. Since the threshold voltage is larger for charged floating gates than for uncharged floating gates, applying a voltage intermediate between the threshold voltages will result in a conducting channel only for the uncharged floating gates. Therefore, the state of a floating gate is determined by the conduction state of the channel upon application of such an intermediate voltage.

For flash memory cells having distinct programming bit line channels and reading bit line channels, such as described above and in FIGS. 1a–4c, the programming operation mode is source side injection. In the source side programming operation mode electrons accelerated from a drain toward a source, in an electron channel induced under both the floating gate and control gate of a cell, are injected from the electron channel into the floating gate. Referring to FIG. 5a, source side injection is achieved for selected cells by the biasing scheme where the source potential, VSS, 22 of FIG. 5a, is about 10.5 volts, the control gate potential, VP2, 24 of FIG. 5a, is about 1.8 volts and the drain potential, VD, 20 of FIG. 5a, is set at VDP, which is defined as the drain potential to achieve 5 microamperes for VSS=10.5 volts and VP2=1.8 volts. This bias scheme is maintained for about 20 microseconds. For unselected cells, for which the floating gates are not to be charged, the bias scheme during programming differs only in that for unselected cells VD=VCC instead of VDP. In the erase operation, for which the erase mode is electron tunneling from the floating gates to the control gates, VD and VSS, 20 and 22 of FIG. 5a, are set to zero volts and the control gate potential, 24, VP2=12.5 volts. This erase operation bias scheme is maintained for about 2 milliseconds. In the reading operation the control gate potential VP2, 30 of FIG. 5b, is set at 2.5 volts, the source potential, VSS, 26 of FIG. 5b is set at zero volts and the drain potential, VD, 28 of FIG. 5b, is set at 1 volt. With this reading operation bias scheme channels under charged floating gates do not turn on and very little current is observed, while channels under uncharged floating gates readily turn on and consequently large currents are observed.

With these bias schemes the operation of traditional flash memory cells having distinct programming bit line channels and reading bit line channels, with structures such as described above and in FIGS. 1a–4c, would seem to be quite satisfactory. However, there are aspects of the structure and the bias scheme, as described above, which are detrimental to the endurance characteristics of the memory cells. The floating gate is a single conductive region that is contained within a cell, while the control gate, which acts as the word line, is a single conductive region that extends over all cells of a column. In addition, the shapes of the parts of the floating gate and control gate that are situated in the programming bit line channel, regions 8 and 12 of FIGS. 3b and 4b, are the same as the shapes of the parts of the floating gate and control gate that are situated in the reading bit line channel, regions 8 and 12 of FIGS. 3c and 4c. Therefore, potentials applied to the control gate during programming will stress regions in both the programming bit line portions and reading bit line portions of the cell. In the source side programming operation mode used, electrons are accelerated from a drain toward a source and an electron channel is required to be induced under both the floating gate and control gate of a cell. It is therefore necessary that the potentials VP2 and VD be applied on the control gate and drain to induce the channel and provide the acceleration. The application of these potentials cause the exertion of stress primarily over insulating layers separating the control and floating gates and the drain from conductive regions at different potentials. This is the case for all regions of the floating and control gates, even those that are situated in the reading bit line channel. Over long term operation of the cell this could lead to degradation in the properties of the stressed insulating layers, which could, for instance, become leaky or could even suffer catastrophic breakdown. Another disadvantage of the traditional structure and bias scheme is the high source potential VSS=10.5 volts that is required to be applied. Such a high potential could more readily induce such detrimental effects as reverse tunneling, punch-through and excessive leakage current. Thus, there are significant disadvantages inherent in the traditional structure and bias scheme stemming from their reduced endurance characteristics.

Li et al. U.S. Pat. No. 6,255,169 B1 discloses a process for fabricating a high-endurance non-volatile memory device. The process includes the step of forming a nitrogen region in a semiconductor substrate prior to carrying out a thermal oxidation process. U.S. Pat. No. 5,648,669 to Sethi et al. shows a high speed flash memory cell.

SUMMARY OF THE INVENTION

It is a primary objective of the invention to provide a structure for a flash memory cell having split programming bit line channel and reading bit line channel with improved endurance characteristics. It is a further primary objective of the invention to provide, in flash memory cells having split programming bit line channel and reading bit line channel, specific structures for the portions of floating gates and control gates that are in programming bit line channels and for those in reading bit line channels, which allows for the reduction of regions under bias and thus results in improved endurance characteristics. It is yet a further primary objective of the invention to provide, in flash memory cells having split programming bit line channel and reading bit line channel, specific structures for the portions of floating gates and control gates that are in programming bit line channels and for those in reading bit line channels that allows for the reduction of the bias required in the programming operation and thus results in improved endurance characteristics. Another primary objective of the invention is to provide a method for fabricating a structure for a flash memory cell having split programming bit line channel and reading bit line channel with improved endurance characteristics. It is a further primary objective of the invention to provide, in flash memory cells having split programming bit line channel and reading bit line channel, a method to fabricate specific structures for the portions of floating gates and control gates that are in programming bit line channels and for those in reading bit line channels, which allows for the reduction of regions under bias and thus results in improved endurance characteristics. It is yet a further primary objective of the invention to provide, in flash memory cells having split programming bit line channel and reading bit line channel, a method to fabricate specific structures for the portions of floating gates and control gates that are in programming bit line channels and for those in reading bit line channels that allows for the reduction of the bias required in the programming operation and thus results in improved endurance characteristics.

These objectives are met in the invention by a structure for the floating gate and control gate of a memory cell, with a split programming bit line channel and reading bit line channel, in which they have a stacked gate configuration in the programming bit line portion and a split gate configuration in the reading bit line portion. With this structure, and using programming hot electron injection as the programming mode, those aspects that lead to a reduction of the endurance characteristics in traditional structures are essentially eliminated. This arises mainly because, during the programming operation, the bias applied to the control gate and the drain can be reduced to zero and the bias on the source can be reduced from 10.5 volt to 8 volt.

A structure for flash memory cells with improved endurance characteristics is disclosed. Isolation regions are formed in a semiconductor region separating cells and also separating programming bit line channel regions of a cell from reading bit line channel regions of a cell. A conductive floating gates has a first portion in the programming bit line channel region of a cell and a second portion in the reading bit line channel region of the cell and a third connecting portion passing over an isolation region. A conductive control gate is separated from the floating gate by an intergate insulator layer and has a first portion entirely disposed over the first floating gate portion, where the first floating gate portion completely covers the space between a source region and a drain region, a second portion disposed over the second floating gate portion, where the second floating gate portion does not extend all the way from a source region to a drain region, the second control gate portion completing the covering of the space between a source region and a drain region and a third connecting portion disposed over the third floating gate portion. A programming bit line channel contact line and a reading bit line channel contact line are disposed over a covering insulator layer and connect to drain regions through the covering insulator layer.

BRIEF DESCRIPTION OF THE DRAWINGS

In the accompanying drawing forming a material part of this description, there is shown:

FIGS. 1a–4c show a method of fabricating a traditional flash memory cell with split programming bit line channel and reading bit line channel.

FIGS. 5a and 5b show the array operation of a traditional flash memory cell with split programming bit line channel and reading bit line channel.

DESCRIPTION OF THE PREFERRED EMBODIMENTS

Figure 6A:
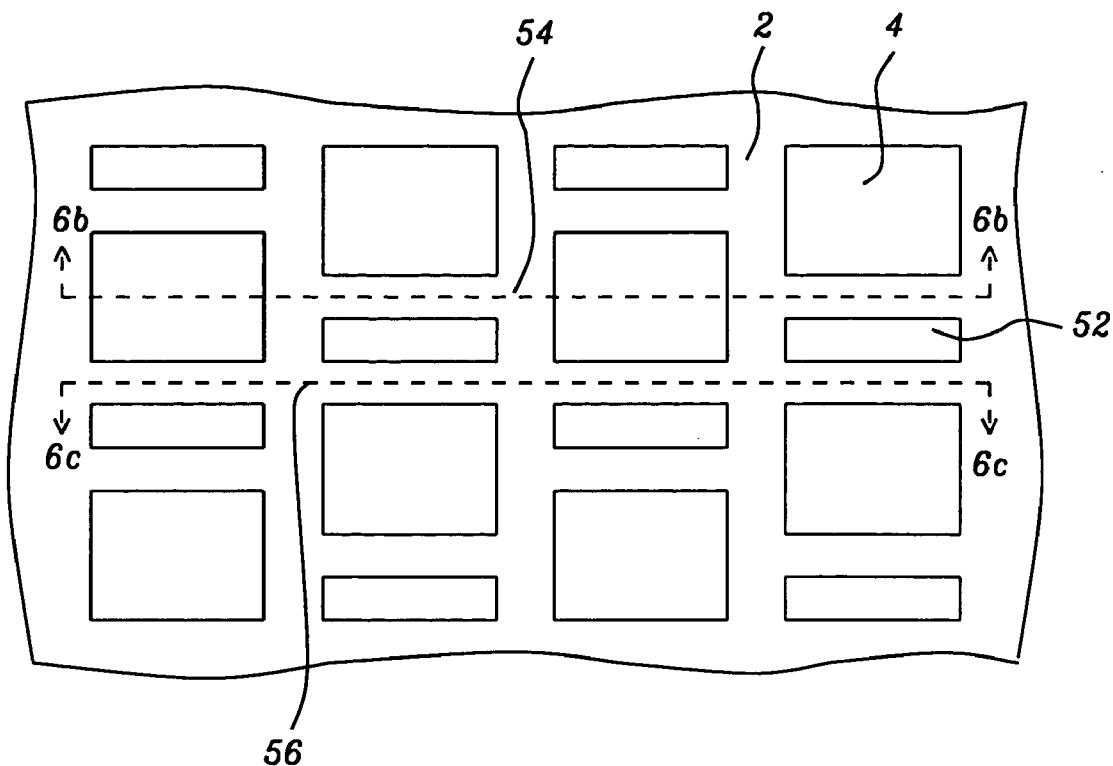
FIGS. 6a–9c show a method of fabricating a flash memory cell with split programming bit line channel and reading bit line channel according to the invention.
Figure 6B:
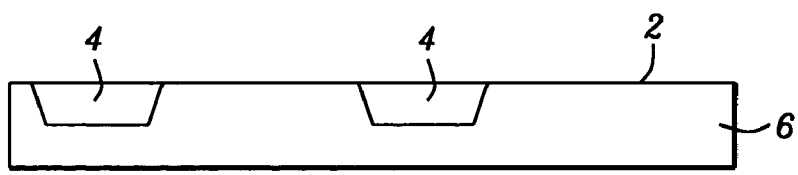
Figure 6C:
Figure 7A:
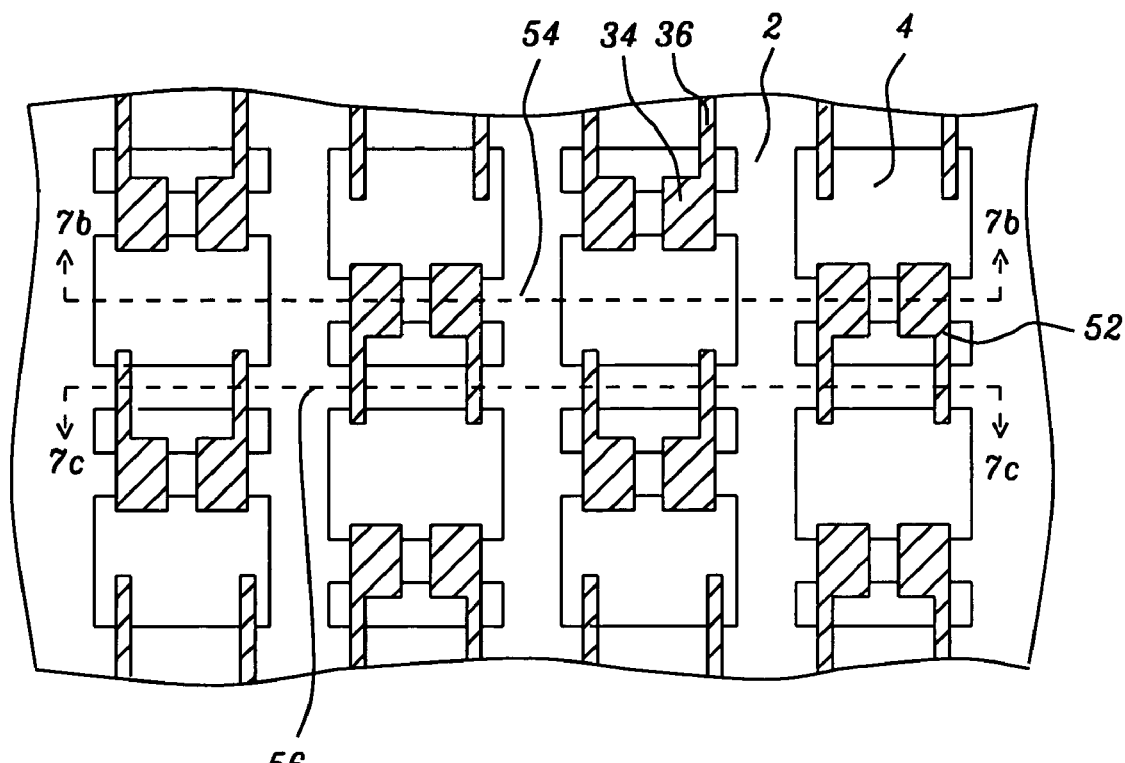
Figure 7B:
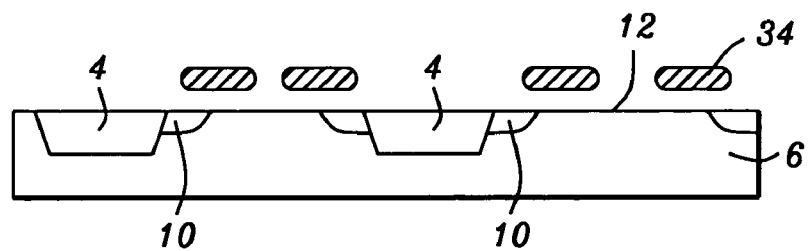
Figure 7C:
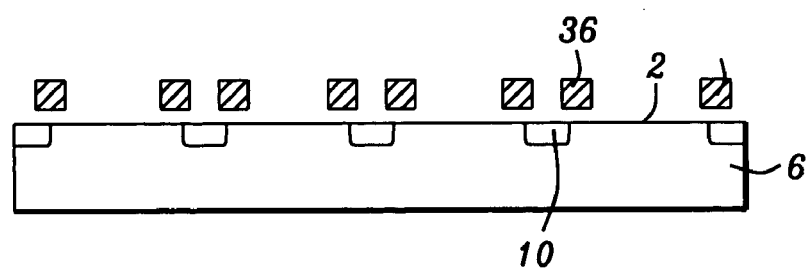

Preferred embodiments of the invention are well described with the aid of FIGS. 6a–10b. A flash memory cell containing distinct programming and reading bit channels according to the invention and a method to fabricate such a memory cell are shown in FIGS. 6a–9c. FIGS. 6a, 7a, 8a and 9a show top views depicting the progression of the process. FIGS. 6b, 7b, 8b and 9b show cross-sectional views depicting stages in forming a programming bit line channel according to the invention and FIGS. 6c, 7c, 8c and 9c show cross-sectional views depicting stages in forming a reading bit line channel according to the invention. Shown in FIGS. 6a, 6b and 6c are isolation regions, regions 4 and 52, which preferably are shallow trench isolation (STI) regions, formed in a semiconductor region, 6, of a substrate, which is preferably a silicon region. Isolation regions 52 are unique to split programming and reading channel memory cells in which they serve to separate programming bit line channel regions, 54 and reading bit line regions, 56, of the memory cell. The area, 2, surrounding the isolation regions is the active area that will contain the memory cell devices. A gate insulator layer, which for the sake of clarity is not explicitly shown in the figure, covers the active region and is preferably a gate oxide layer. As shown in FIGS. 7a, 7b and 7c conductive floating gates, regions 34 and 36, are now formed, which are preferably polysilicon floating gates. It is seen that a floating gate has a portion, 34, situated in the programming bit line channel region, 54 and a portion, 36, situated in the reading bit line channel region, 56 and a connecting portion that passes over the isolation region 52. In contrast to the shape of the traditional floating gates, which are the same in the programming bit line channel as in the reading bit line channel, the floating gates of preferred embodiments of the invention have different shapes for the portion in the programming bit line channel, 34, and for the portion in the reading bit line channel, 36. The floating gate in the programming bit line channel, 34, preferably extends to more than cover the space from source to drain, while in the reading bit line channel that space is only partially covered by the floating gate, 36. In preferred embodiments of the invention the floating gate in the programming bit line channel is wider than the floating gate of the reading bit line channel. An insulating layer that is required over the conductive gate is not explicitly shown and is preferably formed by thermal oxidation. The positions for source regions, 10, are delineated at this stage and the source regions are now formed. Referring now to FIGS. 8a, 8b and 8c, conductive control gates, regions 38 and 40, are shown, which preferably are polysilicon control gates. That portion of the control gate, 38, in the programming bit line channel is entirely disposed over the wider portion of the floating gate. As shown in FIG. 8b the floating gate and control gate in the programming bit line channel are in a "stacked gate" like configuration. In the reading bit line channel, the floating gate and control gate are in "split gate" like configuration, as shown in FIG. 8c, which is the same as for traditional memory cells. In preferred embodiments of the invention the control gate of the reading bit line channel is wider than the control gate of the programming bit line channel. The conductive control gates being parallel conductive lines are appropriate for and are utilized as word lines. At this stage the positions of drain regions, 14, between adjacent control gates, are delineated and the drain regions are now readily formed. As well, referring to FIG. 8a, a source region 14 is disposed in the substrate 6 and adjacent to a first side of the floating gate 34. The isolation region divides the drain region 10 adjacent to the second side of the floating gate 34 into a first drain region 10a and a second drain reaion 10b, wherein width of a portion of the floating gate 34 near the first drain region 10a is smaller than another portion of the floating gate 34 near the second drain region 10b, and width of a portion of the control gate 38 near the first drain region 10a is larger than another portion of the control gate near the second drain region 10b. The next stage of the process is shown in FIGS. 9a, 9b and 9c. An overall insultor layer, 16, is formed and conductive contact lines, 18, and 32, which are the programming and reading bit lines, are disposed over the overall insulator layer, covering the programming bit line channels and the reading bit line channels, respectively and contacting drain regions, 14, through the overall insulator layer, 16. It is seen that there are hardly any process changes required, from those of traditional cells, to fabricate memory cells according to the invention. Only changes in masks are needed to produce the different shapes of the floating gates.

As is well known, the array operation of flash memory devices is accomplished through three basic operations. In programming operations electrons are introduced into floating gates where they are stored. Erasing operations remove the stored charge from floating gates. Thus, there are two states, charged and uncharged, that floating gates could be in. Read operations are used to determine in which of the two states particular floating gates are in. This is accomplished utilizing the affect that a negatively charged floating gate causes an increase in the threshold voltage, which is the applied voltage required to obtain a conducting channel. Since the threshold voltage is larger for charged floating gates than for uncharged floating gates, applying a voltage intermediate between the threshold voltages will result in a conducting channel only for the uncharged floating gates. Therefore, the state of a floating gate is determined by the conduction state of the channel upon application of such an intermediate voltage.

Figure 10A:
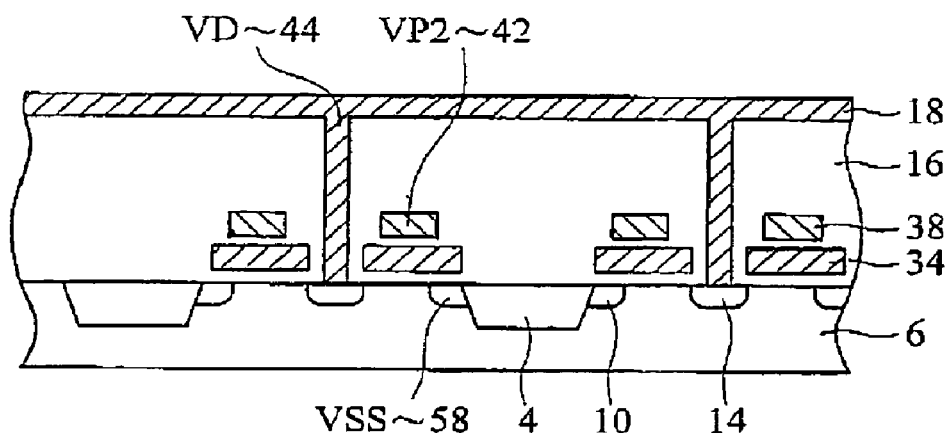
FIGS. 10a and 10b show the array operation of a flash memory cell with split programming bit line channel and reading bit line channel according to the invention.
Figure 10B:
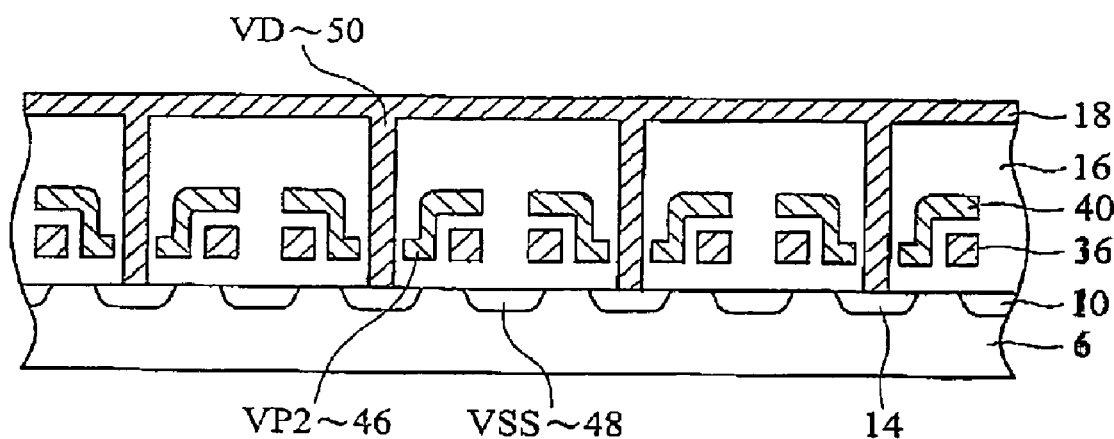

For the flash memory cells structured according to preferred embodiments of the invention the preferred programming operation mode is channel hot electron injection. In the channel hot electron injection programming operation mode electrons are accelerated from a drain toward a source in an electron channel induced under the floating gate of a cell and are injected from the electron channel into the floating gate. Referring to FIG. 10a, channel hot electron injection is achieved for selected cells by the biasing scheme where the source potential, VSS, 58 of FIG. 10a, is about 8 volts, the control gate potential, VP2, 42 of FIG. 10a, is at zero volts and the drain potential, VD, 44 of FIG. 10a, is at zero volts. This bias scheme is maintained for about 50 microseconds. For unselected cells, for which the floating gates are not to be charged, the bias scheme during programming differs only in that for unselected cells the drain is floating. In the erase operation, for which the erase mode is electron tunneling from the floating gates to the control gates, VD and VSS, 44 and 40 of FIG. 10a, are set to zero volts and the control gate potential, 42, VP2=12.5 volts. This erase operation bias scheme is maintained for about 2 milliseconds. In the reading operation the control gate potential VP2, 46 of FIG. 10b, is set at 2.5 volts, the source potential, VSS, 48 of FIG. 10b is set at zero volts and the drain potential, VD, 50 of FIG. 10b, is set at 1 volt. With this reading operation bias scheme channels under charged floating gates do not turn on and very little current is observed, while channels under uncharged floating gates readily turn on and consequently large currents are observed.

Memory cells having structures according to the preferred embodiments of the invention, and using these bias schemes for the operation of the memory cells, do not contain the aspects of the structure and the bias scheme of traditional memory cells which are detrimental to their endurance characteristics. As in traditional memory cells the floating gate is a single conductive region that is contained within a cell, while the control gate, which acts as the word line, is a single conductive region that extends over all cells of a column. However, the shapes of the floating gates and control gates for memory cells of the invention differ crucially from the shapes of the floating gates and control gates of traditional memory cells.

In traditional memory cells the gates form a "split gate" like configuration and the shapes of the parts of the floating gate and control gate that are situated in the programming bit line channel, regions 8 and 12 of FIGS. 3b and 4b, are the same as the shapes of the parts of the floating gate and control gate that are situated in the reading bit line channel, regions 8 and 12 of FIGS. 3c and 4c. Therefore, potentials applied to the control gate during programming will stress regions in both the programming bit line portions and reading bit line portions of the cell. In the source side programming operation mode used, electrons are accelerated from a drain toward a source and an electron channel is required to be induced under both the floating gate and control gate of a cell. It is therefore necessary that the potentials VP2=1.8 volts and VD=VDP be applied on the control gate and drain to induce the channel and provide the acceleration. The application of these potentials cause the exertion of stress primarily over insulating layers separating the control and floating gates and the drain from conductive regions at different potentials. This is the case for all regions of the floating and control gates, even those that are situated in the reading bit line channel. Over long term operation of the cell this could lead to degradation in the properties of the stressed insulating layers, which could, for instance, become leaky or could even suffer catastrophic breakdown. Another disadvantage of the traditional structure and bias scheme is the high source potential VSS=10.5 volts that is required to be applied. Such a high potential could more readily induce such detrimental effects as reverse tunneling, punch-through and excessive leakage current. Thus, there are significant disadvantages inherent in the traditional structure and bias scheme stemming from their reduced endurance characteristics.

Figure 8A:
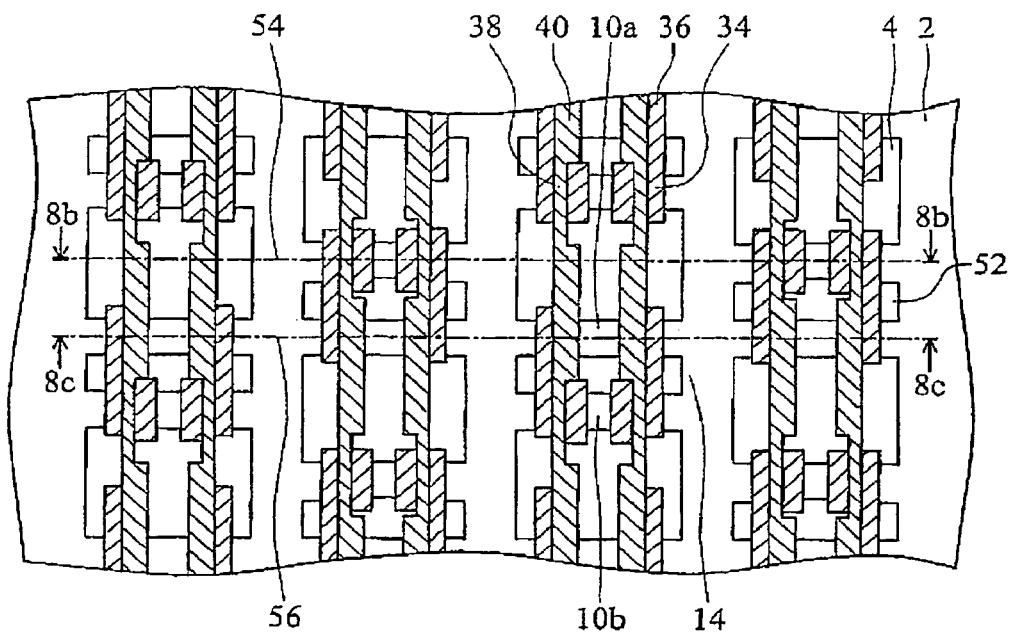
Figure 8B:
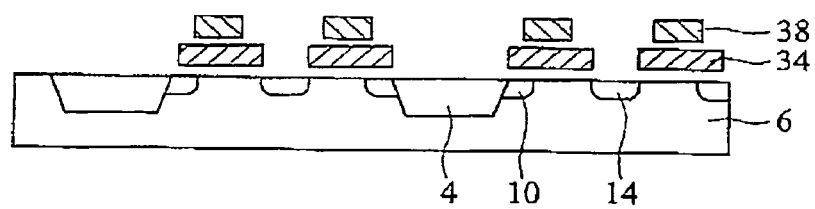
Figure 8C:
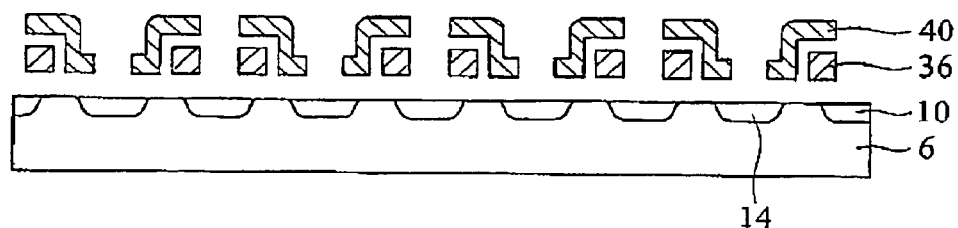
Figure 9A:
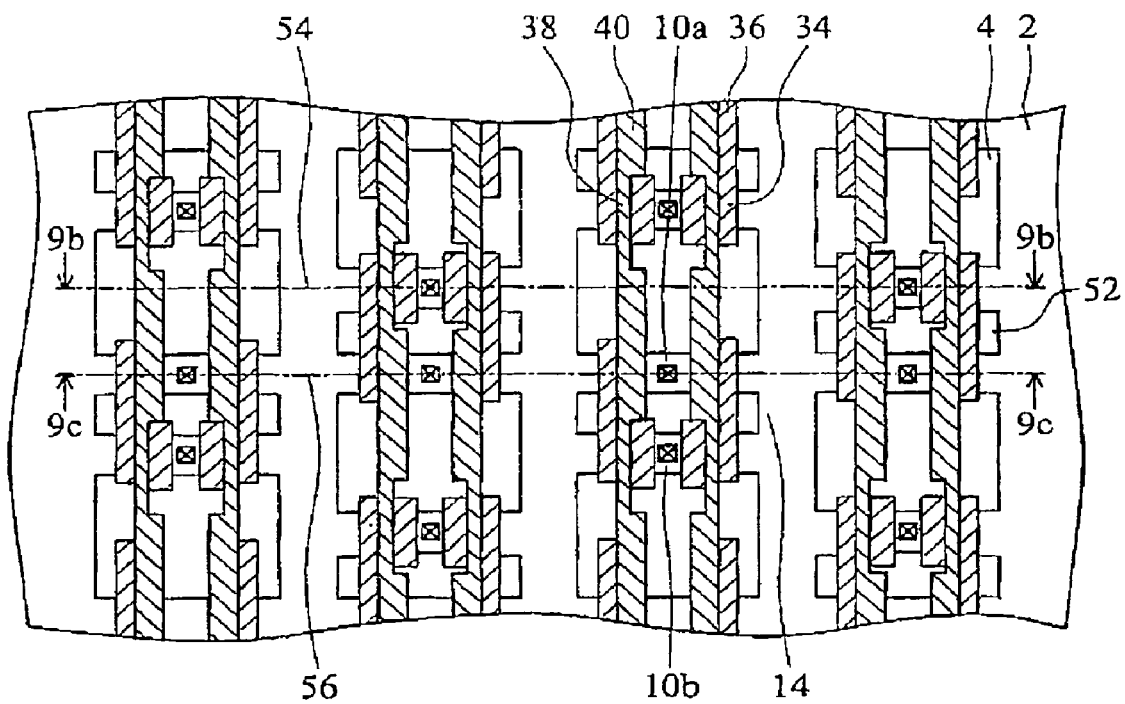
Figure 9B:
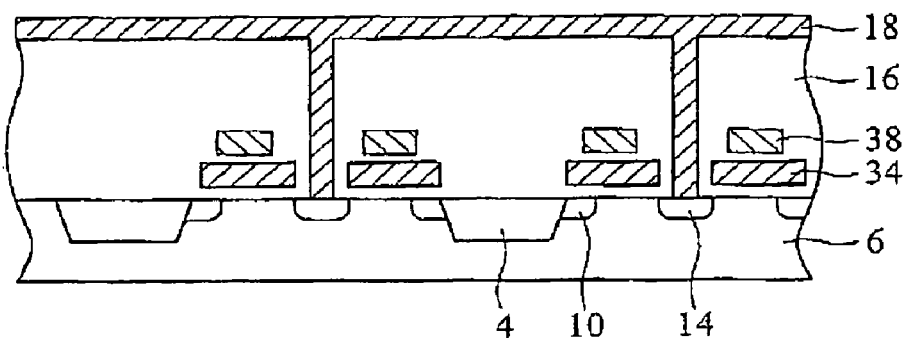
Figure 9C:
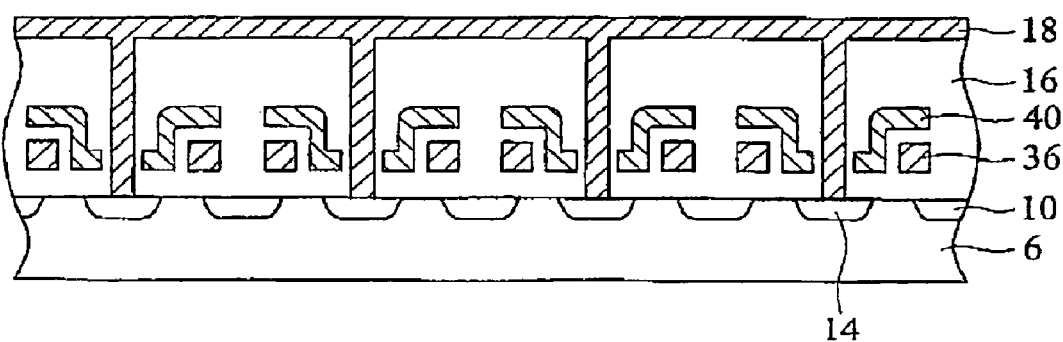

For memory cells according to the invention a "stacked gate" like configuration is attained in the programming bit line channel region, as is shown in FIGS. 8b and 9b and retaining the "split gate" like configuration in the reading bit line channel region, as seen in FIGS. 8c and 9c. In addition for flash memory cells structured according to preferred embodiments of the invention the preferred programming operation mode is channel hot electron injection. It thus possible to reduce the applied bias on the control gate, VP2, and drain, VD from VP2=1.8 volts and VD=VDP for traditional memory cells to zero volts appropriate to memory cells according to preferred embodiments of the invention. A significant reduction is also affected on the required bias on the source, VSS, which is reduced from 10.5 volts to about 8 volts. An important improvement is achieved in the endurance characteristics of the memory cell. Removal of bias, where, due to the innovative changes in structure, it is not necessary and reducing bias, by choosing a more appropriate programming mode, results in significant reductions in the probability of occurrence of such deleterious effects as increased leakage, breakdown, reverse tunneling and punch-through.

While the invention has been particularly shown and described with reference to the preferred embodiments thereof, it will be understood by those skilled in the art that various changes in form and detail may be made without departing from the spirit and scope of the invention.

What is claimed is:

1. A structure for flash memory cells, comprising:
a semiconductor region within a substrate;
first isolation regions, separating cells, and second isolation regions, separating programming bit line channel regions of a cell from reading bit line channel regions of a cell, delineating active regions contained within said semiconductor region;
a conductive floating gate, for each cell, having a first floating gate portion disposed over the active region in the programming bit line channel region of a cell and a second floating gate portion disposed over the active region in the reading bit line channel region of the cell, both said first and said second floating gate portions being separated from said active regions by a floating gate insulator layer disposed over said active regions, and a third floating gate portion passing over said second isolation region to connect said first floating gate portion and second floating gate portion, wherein width of said first floating gate portion is narrower than width of said second floating gate portion;
a conductive control gate separated from said floating gate by an intergate insulator layer and from said semiconductor region by a conirol gate insulator layer and having a first control gate portion entirely disposed over said first floating gate portion, where said first floating gate portion completely covers the space between a first source region and a first drain region, having a second control gate portion disposed over said second floating gate portion, where said second floating gate portion does not extend all the way from a second source region to second drain region, said second control gate region completing the covering of the space between said second source region and said second drain region and having a third control gate portion disposed over said third floating gate portion and connecting said first control gate portion and second control gate portion;
a covering insulator layer with a programming bit line channel contact line disposed over said covering insulator layer and connecting to said first drain region through said covering insulator layer and a reading bit line channel contact line disposed over said covering insulator layer and connecting to said second drain region through said covering insulator layer.

2. The structure of claim 1 wherein said semiconductor region is a silicon region.

3. The structure of claim 1 wherein said substrate is a silicon substrate.

4. The structure of claim 1 wherein said first isolation region is a shallow trench isolation region.

5. The structure of claim 1 wherein said second isolation region is a shallow trench isolation region.

6. The structure of claim 1 wherein said floating gate is a polysilicon floating gale.

7. The stracture of claim 1 wherein said floating gate insulator layer is an oxide layer.

8. The structure of claim 1 wherein said control gate is a polysilicon control gate.

9. The structure of claim 1 wherein said control gate insulator layer is an oxide layer.

10. The structure of claim 1 wherein said intergate insulator layer is an oxide layer grown over said floating gate.

11. The structure of claim 1 wherein said first source region is formed by ion implantation.

12. The structure of claim 1 wherein said first drain region is formed by ion implantation.

13. The structure of claim 1 wherein said second source region is formed by ion implantation.

14. The structure of claim 1 wherein said second drain region is formed by ion implantation.

15. The structure of claim 1 wherein said covering insulator layer is an oxide layer, a nitride layer or an oxynitride layer or a composite layer formed from two or more of the set: oxide layer, nitride layer, oxynitride layer.

16. The structure of claim 1 wherein said programming bit line channel contact line is a polysilicon line.

17. The structure of claim 1 wherein said reading bit line channel contact line is a polysilicon line.

18. A method of forming flash memory cells, comprising:
providing a semiconductor region within a substrate;
forming first isolation regions, separating cells, and forming second isolation regions, separating programming bit line channel regions of a cell from reading bit line channel regions of a cell, first isolation regions and second isolation regions delineating active regions contained within said semiconductor region;
forming a conductive floating gate, in each cell, where a first floating gate portion is disposed over the active region in the programming bit line channel region of a cell and a second floating gate portion is disposed over the active region in the reading bit line channel region of the cell, both said first and said second floating gate portions being separated from said active regions by a floating gate insulator layer formed over said active regions, and a third floating gate portion passes over said second isolation region to connect said first floating gate portion and second floating gate portion, wherein width of said first floating gate portion is narrower than width of said second floating gate portion;
forming a conductive control gate separated from said floating gate by an intergate insulator layer formed over said floating gate and from said semiconductor region by a control gate insulator layer formed over the active region and where a first control gate portion is entirely disposed over said first floating gate portion, where said first floating gate portion is formed to completely cover the space between a first source region and a first drain region, and a second control gate portion is disposed over said second floating gate portion, where said second floating gate portion is formed so as not to extend all the way from a second source region to second drain region, said second control gate region being formed to complete the covering of the space between said second source region and said second drain region and with a third control gate portion formed to be disposed over said third floating gate portion and connecting said first control gate portion and second control gate portion;
forming a covering insulator layer and forming a programming bit line channel contact line disposed over said covering insulator layer and connecting to said first drain region through said covering insulator layer and forming a reading bit line channel contact line disposed over said covering insulator layer and connecting to said second drain region through said covering insulator layer.

19. The method of claim 18 wherein said semiconductor region is a silicon region.

20. The method of claim 18 wherein said substrate is a silicon substrate.

21. The method of claim 18 wherein said first isolation region is a shallow trench isolation region.

22. The method of claim 18 wherein said second isolation region is a shallow trench isolation region.

23. The method of claim 18 wherein said floating gate is a polysilicon floating gate.

24. The method of claim 18 wherein said floating gate insulator layer is an oxide layer.

25. The method of claim 18 wherein said control gate is a polysilicon control gate.

26. The method of claim 18 wherein said control gate insulator layer is an oxide layer.

27. The method of claim 18 wherein said intergate insulator layer is an oxide layer grown over said floating gate.

28. The method of claim 18 wherein said first source region is formed by ion implantation.

29. The method of claim 18 wherein said first drain region is formed by ion implantation.

30. The method of claim 18 wherein said second source region is formed by ion implantation.

31. The method of claim 18 wherein said second drain region is formed by ion implantation.

32. The method of claim 18 wherein said covering insulator layer is an oxide layer, a nitride layer or an oxynitride layer or a composite layer formed from two or more of the set: oxide layer, nitride layer, oxynitride layer.

33. The method of claim 18 wherein said programming bit line channel contact line is a polysilicon line.

34. The method of claim 18 wherein said reading bit line channel contact line is a polysilicon line.

35. A structure for flash memory cells with improved endurance characteristics, comprising:
a semiconductor region within a substrate;
first isolation regions, separating cells, and second isolation regions, separating programming bit line channel regions of a cell from reading bit line channel regions of a cell, delineating active regions contained within said semiconductor region;
a conductive floating gate, for each cell, having a first floating gate portion disposed over the active region a conductive floating gate, for each cell, having a first floating gate portion disposed over the active region in the programming bit line channel region of a cell and a second floating gate portion disposed over the active region in the reading bit line channel region of the cell, both said first and said second floating gate portions being separated from said active regions by a floating gate insulator layer disposed over said active regions, and a third floating gate portion passing over said second isolation region to connect said first floating gate portion and second floating gate portion, wherein width of said first floating gate portion is narrower than width of said second floating gate portion;
a conductive control gate separated from said floating gate by an intergate insulator layer and from said semiconductor region by a control gate insulator layer and having a first control gate portion entirely disposed over said first floating gate portion, where said first floating gate portion is disposed between a first source region and a first drain region and is wider than said second floating gate portion, having a second control gate portion disposed over said second floating gate portion, where said second floating gate portion does not extend all the way from a second source region to second drain region, said second control gate portion, that is wider than said first control gate portion, also covers a space between said second source region and said second drain region and having a third control gate portion disposed over said third floating gate portion and connecting said first control gate portion and second control gate portion;

a covering insulator layer with a programming bit line channel contact line disposed over said covering insulator layer and connecting to said first drain region through said covering insulator layer and a reading bit line channel contact line disposed over said covering insulator layer and connecting to said second drain region through said covering insulator layer.

36. The structure of claim 35 wherein said semiconductor region is a silicon region.

37. The structure of claim 35 wherein said substrate is a silicon substrate.

38. The structure of claim 35 wherein said first isolation region is a shallow trench isolation region.

39. The structure of claim 35 wherein said second isolation region is a shallow trench isolation region.

40. The structure of claim 35 wherein said floating gate is a polysilicon floating gate.

41. The structure of claim 35 wherein said floating gate insulator layer is an oxide layer.

42. The structure of claim 35 wherein said control gate is a polysilicon control gate.

43. The structure of claim 35 wherein said control gate insulator layer is an oxide layer.

44. The structure of claim 35 wherein said intergate insulator layer is an oxide layer grown over said floating gate.

45. The structure of claim 35 wherein said first source region is fanned by ion implantation.

46. The structure of claim 35 wherein said first drain region is formed by ion implantation.

47. The structure of claim 35 wherein said second source region is formed by ion implantation.

48. The structure of claim 35 wherein said second drain region is formed by ion implantation.

49. The structure of claim 35 wherein said covering insulator layer is an oxide layer, a nitride layer or an oxynitride layer or a composite layer formed from two or more of the set: oxide layer, nitride layer, oxynitride layer.

50. The structure of claim 35 wherein said programming bit line channel contact line is a polysilicon line.

51. The structure of claim 35 wherein said reading bit line channel contact line is a polysilicon line.

52. a flash memory device, comprising:

a substrate, a floating gate disposed overlying the substrate;

a control gate disposed overlying the floating gate;

a source region disposed in the substrate and adjacent to a first side of the floating gate;

a first drain region and a second drain region disposed in the substrate and adjacent to a second side of the floating gate; and an isolation region disposed in the substrate and isolates the first and second drain region from each other, wherein width of a portion of the floating gate near the first drain region is smaller than another portion of the floating gate near the second drain region, and width of a portion of the control gate near the first drain region is larger than another portion of the control gate near the second drain region.

* * * * *